(12) United States Patent
Fayrushin et al.

(10) Patent No.: US 11,742,380 B2
(45) Date of Patent: *Aug. 29, 2023

(54) SELECT GATE GATE-INDUCED-DRAIN-LEAKAGE ENHANCEMENT

(71) Applicant: Micron Technology, Inc., Boise, ID (US)

(72) Inventors: Albert Fayrushin, Boise, ID (US); Haitao Liu, Boise, ID (US); Matthew J. King, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/714,740

(22) Filed: Apr. 6, 2022

(65) Prior Publication Data

US 2022/0293726 A1  Sep. 15, 2022

Related U.S. Application Data

(63) Continuation of application No. 17/193,845, filed on Mar. 5, 2021, now Pat. No. 11,362,175.

(51) Int. Cl.
*G11C 16/16* (2006.01)
*H01L 29/06* (2006.01)
(Continued)

(52) U.S. Cl.
CPC ...... *H01L 29/0638* (2013.01); *G11C 16/0483* (2013.01); *G11C 16/16* (2013.01);
(Continued)

(58) Field of Classification Search
None
See application file for complete search history.

(56) References Cited

U.S. PATENT DOCUMENTS 11,362,175 B1 * 6/2022 Fayrushin ......... H01L 27/11582
2010/0327323 A1  12/2010 Choi
(Continued)

FOREIGN PATENT DOCUMENTS

CN  115019845 A  9/2022
CN  115706150 A  2/2023

OTHER PUBLICATIONS

U.S. Appl. No. 17/193,845, filed Mar. 5, 2021, Select Gate Gate-Induced-Drain-Leakage Enhancement.
(Continued)

*Primary Examiner* — Tan T. Nguyen
(74) *Attorney, Agent, or Firm* — Schwegman Lundberg & Woessner, P.A.

(57) ABSTRACT

A variety of applications can include memory devices designed to provide enhanced gate-induced-drain-leakage (GIDL) current during memory erase operations. The enhanced operation can be provided by enhancing the electric field in the channel structures of the topmost select gate transistors to strings of memory cells upon application of a voltage to the gates of the topmost select gate transistors. This electric field can be provided by using a dissected plug as a contact to the channel structure of the topmost select gate transistor, where the dissected plug has one or more conductive regions contacting the channel structure and one or more non-conductive regions contacting the channel structure. The dissected plug can be part of a contact between the data line and the channel structure. Additional devices, systems, and methods are discussed.

20 Claims, 8 Drawing Sheets

(51) Int. Cl.

| | |
|---|---|
| *H01L 29/423* | (2006.01) |
| *H01L 29/66* | (2006.01) |
| *H01L 29/788* | (2006.01) |
| *H01L 29/792* | (2006.01) |
| *G11C 16/04* | (2006.01) |
| *H10B 41/10* | (2023.01) |
| *H10B 41/27* | (2023.01) |
| *H10B 41/35* | (2023.01) |
| *H10B 41/41* | (2023.01) |
| *H10B 43/10* | (2023.01) |
| *H10B 43/27* | (2023.01) |
| *H10B 43/35* | (2023.01) |
| *H10B 43/40* | (2023.01) |

(52) U.S. Cl.
CPC .. *H01L 29/42328* (2013.01); *H01L 29/42344* (2013.01); *H01L 29/66825* (2013.01); *H01L 29/66833* (2013.01); *H01L 29/7889* (2013.01); *H01L 29/7926* (2013.01); *H10B 41/10* (2023.02); *H10B 41/27* (2023.02); *H10B 41/35* (2023.02); *H10B 41/41* (2023.02); *H10B 43/10* (2023.02); *H10B 43/27* (2023.02); *H10B 43/35* (2023.02); *H10B 43/40* (2023.02)

(56) References Cited

U.S. PATENT DOCUMENTS

| | | | |
|---|---|---|---|
| 2011/0180941 A1* | 7/2011 | Hwang | H01L 27/11582 438/599 |
| 2011/0298037 A1* | 12/2011 | Choe | G11C 16/0483 257/314 |
| 2013/0017629 A1 | 1/2013 | Pyo et al. | |
| 2014/0167129 A1 | 6/2014 | Kim | |
| 2017/0069731 A1 | 3/2017 | Kim et al. | |
| 2018/0053768 A1 | 2/2018 | Kim et al. | |
| 2019/0147954 A1* | 5/2019 | Yip | H01L 27/11556 365/185.11 |
| 2020/0066749 A1* | 2/2020 | Yamasaki | H10B 43/35 |
| 2020/0152793 A1* | 5/2020 | Majhi | H01L 29/7849 |
| 2020/0176033 A1* | 6/2020 | Hosotani | G11C 16/0483 |
| 2020/0395374 A1* | 12/2020 | Huo | H01L 27/1157 |
| 2021/0066334 A1 | 3/2021 | Yang | |
| 2023/0041326 A1 | 2/2023 | Clampitt et al. | |

OTHER PUBLICATIONS

U.S. Appl. No. 17/397,603, filed Aug. 9, 2021, Select Gate Transistor With Segmented Channel Fin.

* cited by examiner

SELECT GATE GATE-INDUCED-DRAIN-LEAKAGE ENHANCEMENT

PRIORITY APPLICATION

This application is a continuation of U.S. application Ser. No. 17/193,845, filed Mar. 5, 2021, which is incorporated herein by reference in its entirety.

FIELD OF THE DISCLOSURE

Embodiments of the disclosure relate generally to memory devices and operation of memory devices, and more specifically, to structures and methods related to erase operations of memory devices.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. A 3D X-Point memory is a non-volatile memory (NVM) technology with a stackable cross-grid data access array in which bit storage is based on a change of bulk resistance.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a data line.

Using 3D architectures for memory devices, such as NAND memory devices, can provide increased capacity over planar structures. The memory arrays for 3D structures can include memory cells stacked vertically as strings of memory cells. In selecting one or more strings for access to given memory cells, gating structures can be located at the top and bottom of these strings with memory cells storing data therebetween. The gating structures can include a select gate transistor with its drain coupled to a data line, such as a bitline, at one end of a string and a select gate transistor with its source coupled to a source line at the other end of the string.

In NAND flash devices, an erase operation on a string of memory cells is performed by applying high positive voltages to the string body. In the case of 3D NAND architectures, with the string body of memory cells being electrically isolated, holes can be generated and injected in the string body in order to sustain a positive potential in the string during erase of the memory cells of the string. Gate-Induced-Drain-Leakage (GIDL) is a technique to achieve high-performance and reliable erase operation. It is a leakage mechanism in devices, such as insulated gate field effect transistor (IGFETs), due to large field effect in the drain junction. Existing methods to enhance GIDL operations in a 3D NAND flash memory device include attempts at optimization of the device doping profile of a select transistor to a string of memory cells to make the junction of the select transistor abrupt. With the number of tiers of memory cells, having a floating channel structure, in vertical strings in 3D NAND flash memory devices rising to several hundreds, it is important to provide sufficient GIDL current during erase operations.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
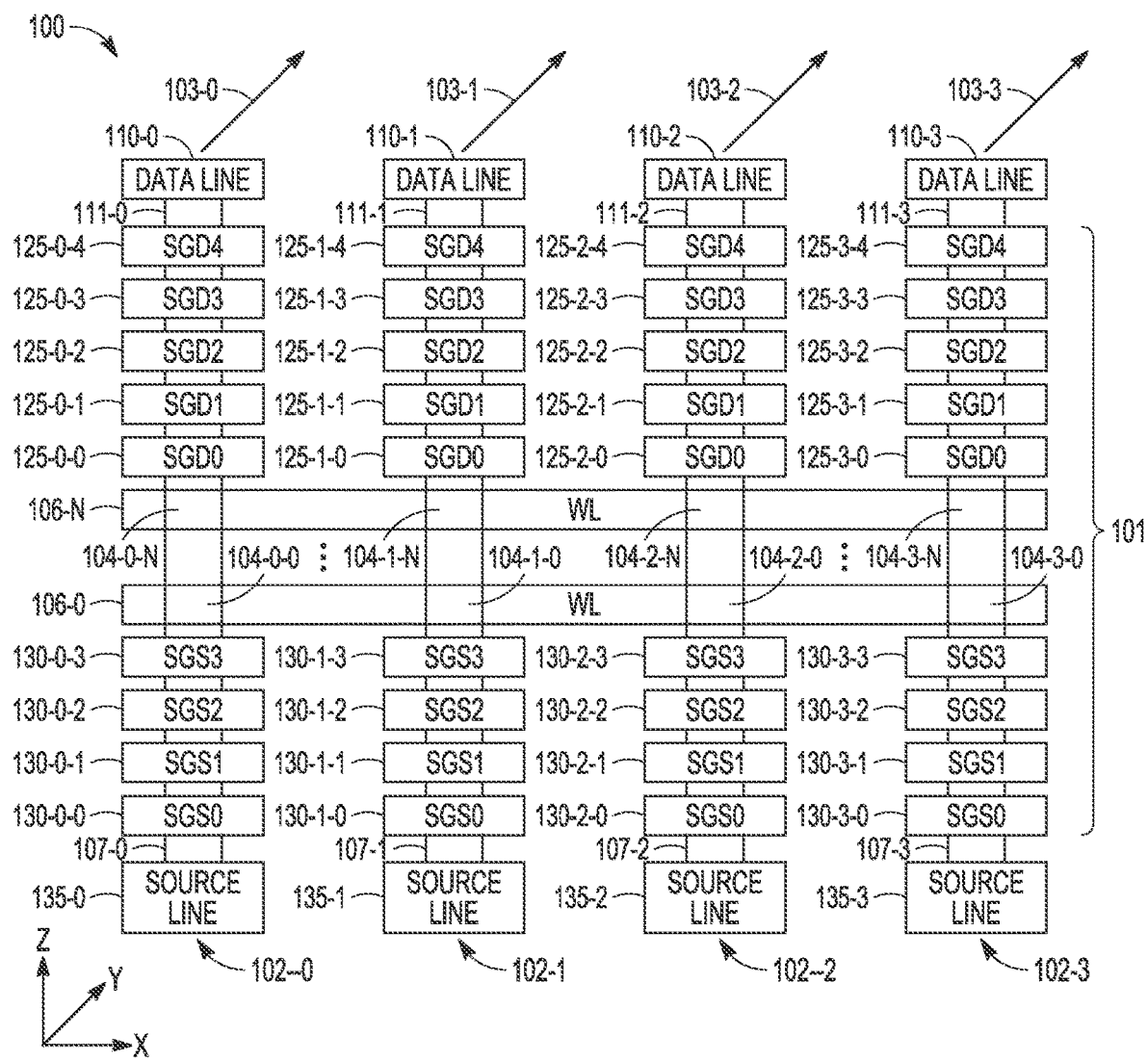
FIG. 1 is a representation of a three-dimensional memory array of a memory die, where the three-dimensional memory array has a memory block that includes multiple sub-blocks, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Both NOR and NAND flash architecture semiconductor memory arrays of flash memory devices are accessed through decoders that activate specific memory cells by selecting an access line (WL) coupled to gates of specific memory cells. In a NOR architecture semiconductor memory array, once activated, the selected memory cells place their data values on data lines, causing different currents to flow depending on the state at which a particular cell is programmed. In a NAND architecture semiconductor memory array, a relatively high bias voltage is applied to a drain-side select gate (SGD) line. Access lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows in the line between the source line and the data line through each series-coupled group, restricted only by the selected memory cells of each group, placing current-encoded data values of selected memory cells on the data lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC has been referred to as a memory cell that can store two bits of data per cell (e.g., one of four programmed states). MLC is used herein in its broader context, to refer to any memory cell(s) that can store more than one bit of data per cell (i.e., that can represent more than two programmed states). Herein, a memory cell that can store two bits of data per cell (e.g., one of four programmed states) is referred to as a dual-level cell (DLC). A triple-level cell (TLC) refers to a memory cell that can store three bits of data per cell (e.g., one of eight programmed states). A quad-level cell (QLC) can store four bits of data per cell, and a penta-level cell (PLC) can store 5 bits of data per cell.

In a string of memory cells in a 3D memory device such as a 3D NAND memory, access to the string to operate on a memory cell in the string cell can be controlled by a gating selector device, such as a select gate, which in the string is in series with the memory cells of the string. In efforts to streamline processing in 3D NAND memory dies, the gating structures defined by selector devices can be fabricated similar to the structures of the memory cells.

In various embodiments, band-to-band charge generation in a channel structure of a transistor is increased at the data line side of a 3D NAND flash pillar based on dissection of the channel structure of the transistor at the top of the pillar. The channel structure can be arranged as a cylindrical channel structure in the pillar. The channel structure is dissected by using a non-continuous conductive contact plug to the channel structure at the data line side of the pillar. The pillar can include a string of memory cells coupled, at one end of the pillar, to a source line by one or more select gate transistors (SGSs) in the pillar that couple to the string of memory cells arranged in series to the source line. At the other end, the string of memory cells can be coupled to the data line by one or more select gate transistors (SGDs) in the pillar that couple the string of memory cells to the data line. The channel structure can run from the topmost SGD through the memory cells of the string through the bottom-most SGS. In various embodiments, pillars of memory cells in a 3D NAND memory array can each include one SGD and one SGS.

The increased generation of band-to-band charge, based on the structural interface of the contact plug with the channel structure of the topmost SGD, can further enhance drain side current GIDL in an erase operation. This interface structure, using a segmented conductive contact to the channel structure of the topmost SGD, provides a different approach from doping optimization between a contact and a channel structure of the topmost SGD. The band-to-band tunneling field giving rise to GIDL current is enhanced by cross-dissecting the channel structure using the segmented conductive contact plug to the channel structure. The cross-dissected channel structure breaks uniformity of the electric field and allows electric field lines to concentrate in the dissected area, enhancing band-to-band offset. The segmented conductive plug to the channel structure, providing the dissected channel structure, can be implemented using an additional mask to make cuts to the plug that couples the data line to the channel structure, when processing the pillars of select devices and memory cells to data lines of a memory array of a memory device. Additional conductive regions can be used to connect the plug, having separated conductive segments contacting the channel structure of the topmost SGD, to the associated data line.

FIG. 1 is a representation of a 3D memory array 100 of a memory die, where the 3D memory array 100 has a memory block 101 that includes sub-blocks 102-0, 102-1, 102-2, and 102-3. Though one memory block of memory cells is shown, a memory die can include more than one block of memory cells. Though four sub-blocks are shown in the block 101 of memory cells, a block of memory cells can include more or less than four sub-blocks. Sub-block 102-0 includes a string 107-0, structured as a pillar, having selector devices 125-0-0 . . . 125-0-4 arranged vertically in a series with a top-most selector device 125-0-4 coupled at one end of the series, to couple the string 107-0 to a data line 110-0. The coupling of the string 107-0 to a data line 110-0 can include a dissected plug 111-0 providing a segmented conductive contact to a channel structure of selector device 125-0-4. Selector device 125-0-0 of the sub-block 102-0 is coupled to a top-most memory cell 104-0-N of a set of memory cells 104-0-0 . . . 104-0-N that are arranged vertically in the string of sub-block 102-0.

The memory cells 104-0-0 . . . 104-0-N are coupled to access lines 106-0 . . . 106-N, respectively. The bottom-most memory cell 104-0-0 of the set of memory cells of the string is coupled to a top-most selector device 130-0-3 of selector devices 130-0-0 . . . 130-0-3 arranged vertically in a series with bottom-most selector device 130-0-0 coupled to a source line 135-0 for sub-block 102-0. The selector devices 125-0-0 . . . 125-0-4 can be select gates SGDs fabricated as transistors with the structure of the memory cells 104-0-0 . . . 104-0-N and be referred to as SGD0, SGD1, SGD2, SGD3, and SGD4 of sub-block 102-0. The selector devices 130-0-0 . . . 130-0-3 can be source-side select gates, SGSs, fabricated as transistors with the structure of the memory cells 104-0-0 . . . 104-0-N and be referred to as SGS0, SGS1, SGS2, and SGS3 of sub-block 102-0. The string of sub-block 102-0 can be repeated along direction 103-0 in the y-direction, with select lines to the selector devices 125-0-0 . . . 125-0-4 and to the selector devices 130-0-0 . . . 130-0-3 effectively along the direction 103-0.

Sub-block 102-1 includes a string 107-1, structured as a pillar, having selector devices 125-1-0 . . . 125-1-4 arranged vertically in a series with a top-most selector device 125-1-4 coupled at one end of the series, to couple the string 107-1 to a data line 110-1. The coupling of the string 107-1 to a data line 110-1 can include a dissected plug 111-1 providing a segmented conductive contact to a channel structure of selector device 125-1-4. Selector device 125-1-0 of the sub-block 102-1 is coupled to a top-most memory cell 104-1-N of a set of memory cells 104-1-0 . . . 104-1-N that are arranged vertically in the string of sub-block 102-1.

The memory cells 104-1-0 . . . 104-1-N are coupled to access lines 106-0 . . . 106-N, respectively. The bottom-most memory cell 104-1-0 of the set of memory cells of the string is coupled to a top-most selector device 130-1-3 of selector devices 130-1-0 . . . 130-1-3 arranged vertically in a series with bottom-most selector device 130-1-0 coupled to a source line 135-1 for sub-block 102-1. The selector devices 125-1-0 . . . 125-1-4 can be select gates SGDs fabricated as transistors with the structure of the memory cells 104-1-0 . . . 104-1-N and be referred to as SGD0, SGD1, SGD2, SGD3, and SGD4 of sub-block 102-1. The selector devices 130-1-0 . . . 130-1-3 can be select gates SGSs fabricated as transistors with the structure of the memory cells 104-1-0 . . . 104-1-N and be referred to as SGS0, SGS1, SGS2, and SGS3 of sub-block 102-1. The string of sub-block 102-1 can be repeated along direction 103-1 in the y-direction, with select lines to the selector devices 125-1-0 . . . 125-1-4 and to the selector devices 130-1-0 . . . 130-1-3 effectively along the direction 103-1.

Sub-block 102-2 includes a string 107-2, structured as a pillar, having selector devices 125-2-0 . . . 125-2-4 arranged vertically in a series with a top-most selector device 125-2-4 coupled at one end of the series, to couple the string 107-2 to a data line 110-2. The coupling of the string 107-2 to a data line 110-2 can include a dissected plug 111-2 providing a segmented conductive contact to a channel structure of selector device 125-2-4. Selector device 125-2-0 of the sub-block 102-2 is coupled to a top-most memory cell 104-2-N of a set of memory cells 104-2-0 . . . 104-2-N that are arranged vertically in the string of sub-block 102-2.

The memory cells 104-2-0 . . . 104-2-N are coupled to access lines 106-0 . . . 106-N, respectively. The bottom-most memory cell 104-2-0 of the set of memory cells of the string is coupled to a top-most selector device 130-2-3 of selector devices 130-2-0 . . . 130-2-3 arranged vertically in a series with bottom-most selector device 130-2-0 coupled to a source line 135-2 for sub-block 102-2. The selector devices 125-2-0 . . . 125-2-4 can be select gates SGDs fabricated as transistors with the structure of the memory cells 104-2-0 . . . 104-2-N and be referred to as SGD0, SGD1, SGD2, SGD3, and SGD4 of sub-block 102-2. The selector devices 130-2-0 . . . 130-2-3 can be select gates SGSs fabricated as transistors with the structure of the memory cells 104-2-0 . . . 104-2-N and be referred to as SGS0, SGS1, SGS2, and SGS3 of sub-block 102-2. The string of sub-block 102-2 can be repeated along direction 103-2 in the y-direction, with select lines to the selector devices 125-2-0 . . . 125-2-4 and to the selector devices 130-2-0 . . . 130-2-3 effectively along the direction 103-2.

Sub-block 102-3 includes a string 107-3, structured as a pillar, having selector devices 125-3-0 . . . 125-3-4 arranged vertically in a series with a top-most selector device 125-3-4 coupled at one end of the series, to couple the string 107-3 to a data line 110-3. The coupling of the string 107-3 to a data line 110-3 can include a dissected plug 111-3 providing a segmented conductive contact to a channel structure of selector device 125-3-4. Selector device 125-3-0 of the sub-block 102-3 is coupled to a top-most memory cell 104-3-N of a set of memory cells 104-3-0 . . . 104-3-N that are arranged vertically in the string of sub-block 102-3.

The memory cells 104-3-0 . . . 104-3-N are coupled to access lines 106-0 . . . 106-N, respectively. The bottom-most memory cell 104-3-0 of the set of memory cells of the string is coupled to a top-most selector device 130-3-3 of selector devices 130-3-0 . . . 130-3-3 arranged vertically in a series with bottom-most selector device 130-3-0 coupled to a source line 135-3 for sub-block 102-3. The selector devices 125-3-0 . . . 125-3-4 can be select gates SGDs fabricated as transistors with the structure of the memory cells 104-3-0 . . . 104-3-N and be referred to as SGD0, SGD1, SGD2, SGD3, and SGD4 of sub-block 102-3. The selector devices 130-3-0 . . . 130-3-3 can be select gates SGSs fabricated as transistors with the structure of the memory cells 104-3-0 . . . 104-3-N and be referred to as SGS0, SGS1, SGS2, and SGS3 of sub-block 102-2. The string of sub-block 102-3 can be repeated along direction 103-3 in the y-direction, with select lines to the selector devices 125-3-0 . . . 125-3-4 and to the selector devices 130-3-0 . . . 130-3-3 effectively along the direction 103-3.

The memory array 100 can be implemented in a replacement gate (RG) NAND memory die. The term RG refers to a process of fabricating the NAND memory die, which process can also be referred to as a "gate-last" processing technique. In the RG processing technique, sacrificial regions are deposited to be later removed in the processing of the memory die followed by forming material for transistor gates of the memory cells in a string. The RG process can be used in processing the SGS and SGD devices of the memory array 100.

In a non-limiting example, each of the four sub-blocks 102-0, 102-1, 102-2, and 102-3 of the memory block 101 can be structured for, but not limited to, 16 KB in which 16K*8 data lines are implemented. Each of the four sub-blocks 102-0, 102-1, 102-2, and 102-3 can have 16K*8 strings along directions 103-0, 103-1, 103-2, and 103-3, respectively, with each string formed in a semiconductor pillar along its respective direction. Each string can have a number of horizontal levels, referred to as tiers, for example, the strings of the memory array 100 can have 128 tiers. On a tier (horizontal level), a string can have a memory cell, a SGD, or a SGS. SGDs and SGSs are not shared across sub-blocks 102-0, 102-1, 102-2, and 102-3 for reading from or writing to memory cells. In some instances, SGD0, SGD1, SGD2, SGD3, and SGD4 of each string can be arranged with a number of the upper-most SGDs, for example SGD3 and SGD4, arranged as switches to operate as GIDL generators. The SGS0, SGS1, SGS2, and SGS3 of each string can also be arranged with a number of the lower-most SGSs, for example SGS0, arranged as a switch to operate as a GIDL generator. These GIDL generators can be used to assist during an erase operation to speed up the charging of the body of the memory cell strings in a selected sub-block. With SGD3 and SGD4 arranged with respect to GIDL generators, SGD0, SGD1, and SGD2 in each string can operate as a single select gate on the drain side and SGS1, SGS2, and SGS3 in each string can operate as a single select gate on the source side. Alternatively, SGD0, SGD1, SGD2, SGD3, and SGD4 can be arranged as a single SGD that can include GIDL function in an erase operation.

The selector devices of the memory array 100 of FIG. 1 can be structured like the memory cells of the memory array 100 such that common processing can be used to reduce fabrication complexity and cost with respect to fabrication using different processes. Since every layer of the memory array is being fabricated in the same manner, the layer fabrication follows the manner in which each access line or memory cell is being fabricated. The structure of the memory cells effectively dictates how a selector device, such as a select gate, is also fabricated. Typically, the design for a memory cell is to make the memory cell as small as possible so that more memory cells can be stacked in a given pillar. Though memory cells are being scaled to thinner and thinner vertical levels, such scaling for the selector device has an issue associated with the selector device's responsibility to select an entire string. This responsibility of the selector device can be more critical than a regular memory cell. The selector device built like a memory cell has a small feature size, which can lead to current leakage. With a small channel structure feature, the selector device may not have good control for turn off of the string. One option is to create a selector device, such as a select gate, that is much thicker, having a relatively long channel structure. However, in this option, the selector device and the memory cells would not have a common fabrication process, and a switch to a process different from forming memory cells would be used in making the selector device. To use a selector device with the memory cell structure, compensation for the small size of the selector device can be provided by having multiple selector devices. These multiple selector devices, for example on the drain side of a string, can operate as a single selector device with only one electrical signal controlling it; and, in some examples multiple selector devices at one end of the string may be operated as two or more separately operated groups. In such an example, each such selector device can be coupled to an individual respective select line, or each group of selector devices may be coupled to a respective select line. For example, with SGD3 and SGD4 arranged with respect to GIDL generators, SGD0, SGD1, and SGD2 of FIG. 1 can be electrically ganged together and controlled like a single large channel structure or a single long channel structure select gate.

By "ganged together," it is meant that the same voltage is applied to the multiple components or devices that are the subject of being electrically ganged together or to which a signal, such as a pulse for a write or read operation, is applied. Such an applied pulse can be referred to as a ganged pulse. An example of a vertical gang is the application of the same voltage to SGD0, SGD1, and SGD2 in a single given sub-block. A vertical gang can be performed, for example, during a read or write operation. An example of a horizontal gang is the application of the same voltage to similar devices across the sub-blocks 102-0, 102-1, 102-2, and 102-3. A horizontal gang can be performed in application of a program voltage (VPGM) to SGD0 only in each of the sub-blocks 102-0, 102-1, 102-2, and 102-3 and to apply the VPGM voltage concurrently for all SGD0s of these four sub-blocks. In this horizontal example, one VPGM driver can be selectively connected to drive the four SGD0s of the different sub-blocks.

With the selector devices of the memory array 100 structured like the memory cells of the memory array 100, these selector devices are programmable. The selector devices are programmed once after fabrication in production flow to set the threshold voltage (Vt) for operation of the memory die. For memory cells of a memory array fabricated as charge trap structures in vertical strings, the selector devices can be fabricated as charge trap structures in the vertical strings. The charge trap structures of the memory cells and the selector devices can be fabricated having the same structural parameters such as channel length, materials, dimensions of regions of the charge trap structures, etc. At the end of fabrication, the selector devices can be programmed to have a set Vt by controlling charge stored in the charge trap structures that are the selector devices. After setting, this Vt is intended to be stable through the end of life of the NAND memory die. Procedures can be adopted to maintain this stability.

Figure 2:
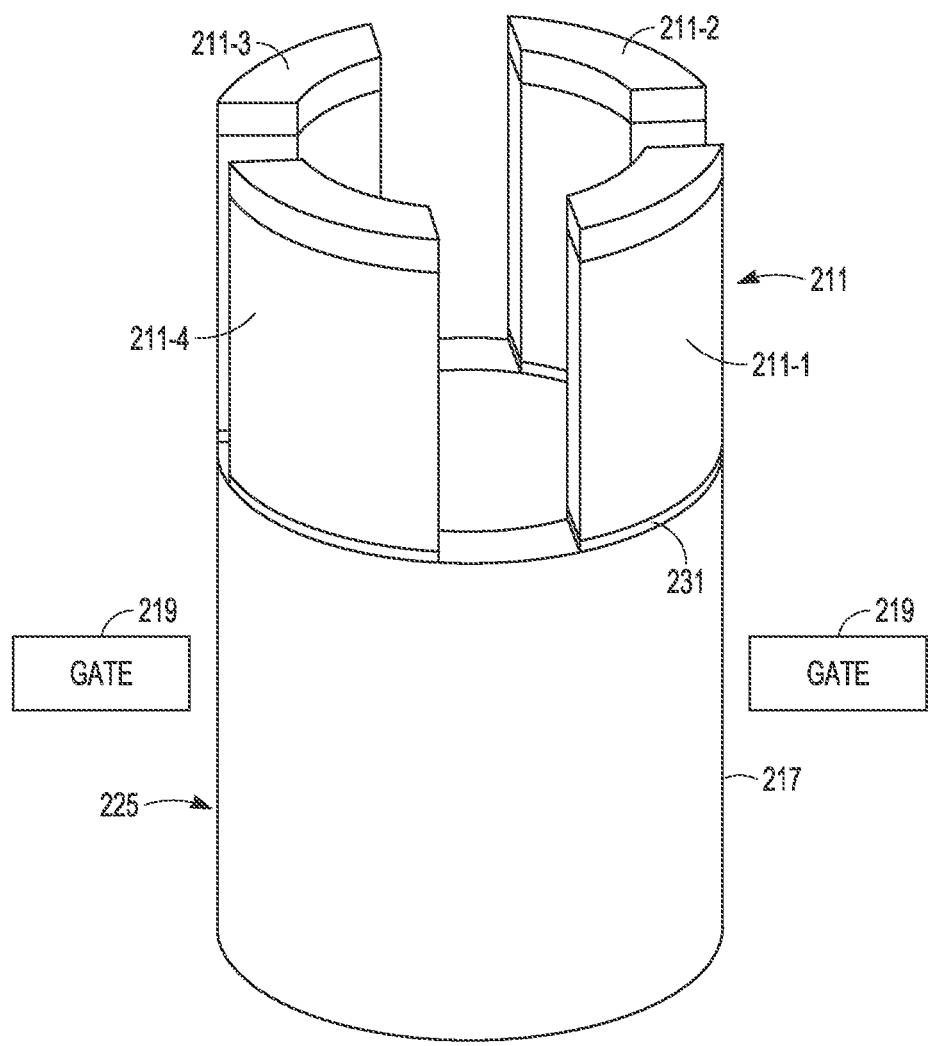
FIG. 2 illustrates a side view of a top of a pillar with a dissected plug for providing a conductive contact to couple a data line to a channel structure of a transistor, according to various embodiments.

FIG. 2 illustrates a side view of a top of a pillar with a dissected plug 211 for providing a conductive contact to couple a data line to a channel structure 217. The dissected plug 211 includes conductive regions 211-1, 211-2, 211-3, and 211-4 separated by non-conductive regions shown as gaps in FIG. 2. The gaps can be filled with dielectric material. The gaps can be left as voids providing non-conductive regions of the plug 211. Though four conductive regions are shown, the dissected plug 211 can be structured with one or more conductive regions on and contacting the channel structure 217 with one or more non-conductive regions on and contacting the channel structure 217, providing a dissected channel structure with respect to contacting an associated data line. The channel structure 217 can be a channel structure in a select transistor 225 in the pillar that provides a string of memory cells. For ease of presentation, a data line, a pillar, and structure of the select transistor 225 between the channel structure 217 and a gate 219 are not shown in FIG. 2. The pillar can be formed as a cylindrical structure or a cylindrical-like structure vertically above source lines. A cylindrical-like structure can be a circular cylindrical structure or a non-circular cylindrical structure. Material of the channel structure 217 can extend along the pillar, forming channel structures of the select gate transistors and the memory cells in the pillar. Dissected plugs, such as dissected plug 211, can be used for coupling strings 107-0, 107-1, 107-2, and 107-3 to data line 110-0, 110-1, 110-2, and 110-3 of memory array 100 of FIG. 1.

The dissected plug 211 can be formed as dissected data line plug up to or beyond a junction 231 with the channel structure 217. The channel structure 217 can be a low doped channel structure with the conductive regions 211-1, 211-2, 211-3, and 211-4 of dissected plug 211, shown in FIG. 2, being heavily doped relative to the channel structure 217. The channel structure 217 can be n type material or p type material. The conductive regions 211-1, 211-2, 211-3, and 211-4 of the dissected plug 211 can be structured as material with $n^+$ doping with the channel structure 217 being material of $n^-$ doping. The conductive regions 211-1, 211-2, 211-3, and 211-4 of the dissected plug 211 can be, but are not limited to, polysilicon material. The channel structure 217 can be, but is not limited to, polysilicon material. The use of the dissected plug 211 contacting the channel structure 217 allows enhancement of an applied electrical field in the channel structure 217 that can enhance band-to-band tunneling. The enhancement can be an enhancement of several times or orders of magnitude.

Figure 3:
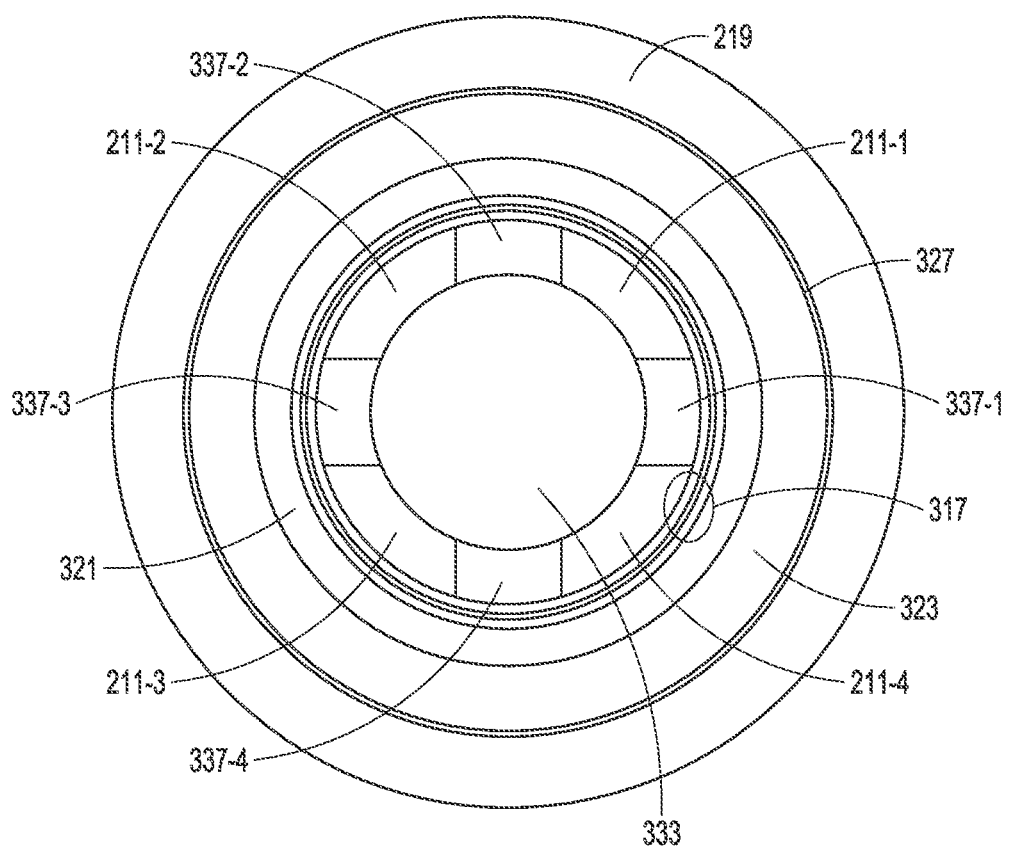
FIG. 3 illustrates a top view of the structure of FIG. 2, according to various embodiments.

FIG. 3 illustrates a top view of the pillar structure with plug 211 of FIG. 2. The pillar includes a core 333 around which select gate transistors and transistor structures for memory cells can be arranged. The core 333 is composed of non-conductive material such as one or more dielectric materials. The core 333 can be, but is not limited to, an insulating oxide to fill the inner portion of the pillar. The oxide can be a dielectric silicon based oxide. The conductive regions 211-1, 211-2, 211-3, and 211-4 of dissected plug 211 of FIG. 2 are on and contacting the channel structure 217 of FIG. 2. The dissected plug 211 can cover the channel structure in a continuous manner in a direction similar to the perimeter of the pillar to which the channel structure is formed. For those regions of the channel structure 217 not covered by the dissected plug 211, these regions can be covered by dielectric material vertically adjacent and contacting the dissected plug 211. The conductive regions 211-1, 211-2, 211-3, and 211-4 are non-continuous regions with respect to each other separated by non-conductive regions 337-1, 337-2, 337-3, and 337-4 of the plug 211 of FIG. 2. The non-conductive regions 337-1, 337-2, 337-3, and 337-4 can be dielectric material. In various embodiments, the dielectric material of the non-conductive regions 337-1, 337-2, 337-3, and 337-4 and the material of the core 333 can have the same material structure.

In this top view, the structure of the top transistor of the pillar is shown, where the top transistor can be a select gate transistor. The structure shown is adjacent the channel structure covered by the conductive regions 211-1, 211-2, 211-3, and 211-4 and the non-conductive regions 337-1, 337-2, 337-3, and 337-4. The gate 219 of FIG. 2 is vertically on and contacting a dielectric barrier 327, with the dielectric barrier 327 vertically on and contacting a blocking dielectric 323. The blocking dielectric 323 can be a silicon-based dielectric or another dielectric such as a high-k dielectric. The dielectric barrier 327 can be a silicon-based dielectric or another dielectric such as a high-k dielectric. Material for the dielectric barrier 327 can be different from the material for the blocking dielectric 323. The term "high-k dielectric" means a dielectric having a dielectric constant greater than that of silicon dioxide. The high-k material can be one or more of aluminum oxide, hafnium oxide, zirconium oxide, tantalum oxide, other dielectrics such non-conductive nitrides, combinations therefor, etc. The dielectric barrier 327 or the blocking dielectric 323 can be a single homogenous material or may comprise two or more discrete compositions. For instance, in various embodiments, the dielectric barrier 327 can comprise a laminate of silicon dioxide and one or more high-k materials. In various embodiments, the dielectric barrier 327 can be structured as a nanolaminate including at least one high-k material. The term "nanolaminate" means a composite film of ultra thin layers of two or more materials in a layered stack. Typically, each layer in a nanolaminate has a layer thickness at the nanometer scale. The material for dielectric barrier 327 can be formed with a total thickness in the range of 10 to 50 angstroms.

The blocking dielectric 323 is on and contacting a charge trap region 321. The charge trap region 321 can be a nitride region, such as a region including dielectric silicon nitride, or other suitable dielectric region to trap charge. The charge trap region 321 is separated from the channel structure 217 by a tunnel region 317. The tunnel region 317 can be constructed as an engineered region to meet a selected criterion, such as, for example but not limited to, an equivalent oxide thickness (EOT). The EOT quantifies the electrical properties of tunnel region 317, such as capacitance, of a dielectric in terms of a representative physical thickness. For example, EOT can be defined as the thickness of a theoretical $SiO_2$ layer that would be required to have the same capacitance density as a given dielectric (tunneling region 317), ignoring leakage current and reliability considerations. The tunnel region 317 can include an oxide and a nitride. Tunnel region 317 may include a set of dielectric barriers. The tunnel region 317 can be a veridical three component tunnel region arranged as a horizontal stack from the channel structure 217 to the charge trap region 321. The three component tunnel region 317 can be structured with a dielectric oxide followed by a region of dielectric nitride followed by another region of dielectric oxide. Alternatively, tunnel region 317 can be a two component tunnel region or a one component tunnel region. Further, tunnel region 317 can have four or more regions, where the selection of material and thicknesses depends on the capability of the material with the given thicknesses to perform as a tunneling region to charge trap region 321.

The junction line with the channel structure at the location of the conductive regions of the dissected plug contacting the non-conductive regions of the dissected plug enhances the electric field at the channel structure with the application of a voltage to the gate of the GIDL generator, enhancing band-to-band charge generation in a channel structure. This results in enhanced GIDL operation. In a simulation with respect to the dissected data line plug and a conventional data line, the band-to-band charge generation in the channel structure, at the location of the conductive regions of the dissected plug contacting the non-conductive regions of the dissected plug, can reach orders of magnitude greater than that of a conventional data line plug with the same doping of the plug and channel structure. The cutting depth of the dissected data line plug (i.e., vertical extent of the conductive regions of the dissected plug) can be increased without affecting the band-to-band charge generation. Further enhancement of the band-to-band charge generation can be attained by optimization of the junction doping between the dissected plug and the channel structure. Enhancement for future high-aspect ratio tiers, as larger pillars of memory cells are used, can be provided by such combination of junction doping optimization plus plug dissection. Dissected contact plugs, as taught herein, can be used in other applications.

Figure 4:
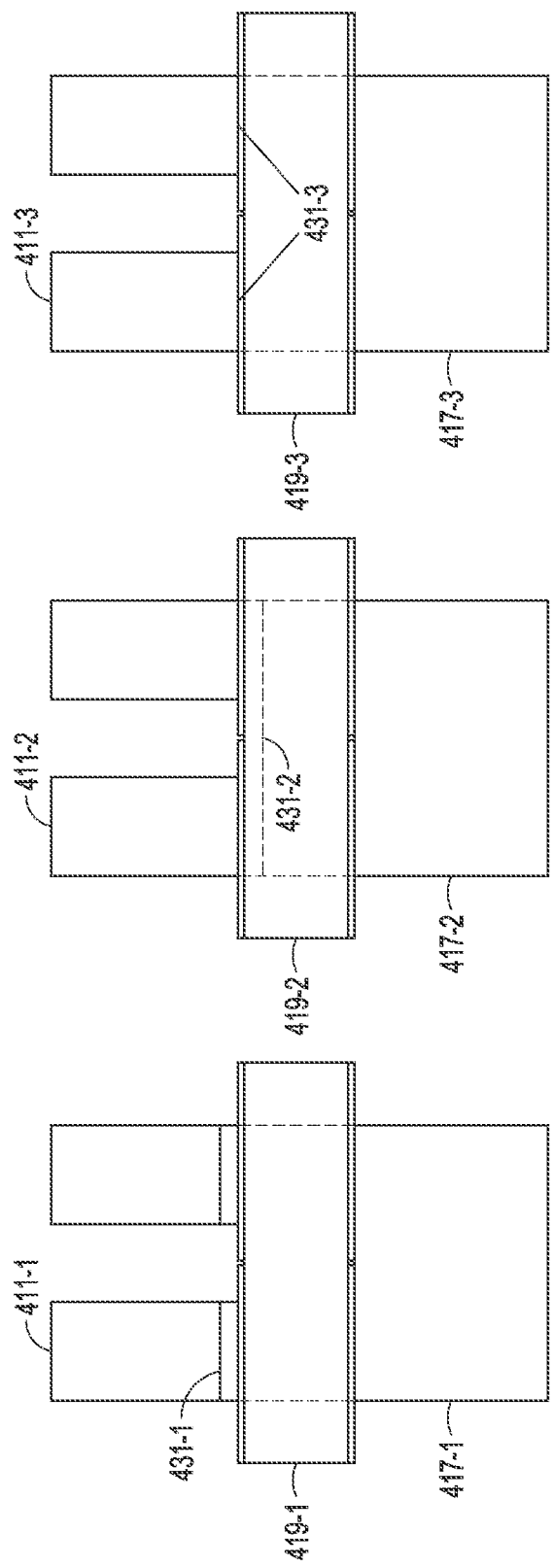
FIGS. 4A-C illustrate three different arrangements of an interface of a dissected plug with a channel structure of a transistor with respect to a gate of the transistor, according to various embodiments.

FIGS. 4A-C illustrate three different arrangements of an interface of a dissected plug with a channel structure of a transistor with respect to a gate of the transistor. The transistor can be used as the topmost select gate transistor for a string of memory cells in a memory array. FIG. 4A illustrates an arrangement of an interface 431-1 of conductive regions 411-1 of a plug with a channel structure 417-1 of a transistor with respect to a gate 419-1 of the transistor. The position of the interface 431-1 indicates that the junction of the conductive regions 411-1 of the plug with the channel structure 417-1 is in an underlap with respect to the top of the gate 419-1. This underlap with respect to doping has the interface 431-1 above the top of the gate 419-1 with the cut between the conductive regions extending vertically below the interface 431-1. A non-limiting example of an underlap is 5 nm.

FIG. 4B illustrates an arrangement of an interface 431-2 of conductive regions 411-2 of a plug with a channel structure 417-2 of a transistor with respect to a gate 419-2 of the transistor. The position of the interface 431-2 indicates that the junction of the conductive regions 411-2 of the plug with the channel structure 417-2 is in an overlap with respect to the top of the gate 419-2. This overlap with respect to doping has the interface 431-2 below the top of the gate 419-2 with the cut between conductive regions ending vertically above the interface 431-2. A non-limiting example of an overlap is 5 nm.

FIG. 4C illustrates an arrangement of an interface 431-3 of conductive regions 411-3 of a plug with a channel structure 417-3 of a transistor with respect to a gate 419-3 of the transistor. The position of the interface 431-3 indicates that the junction of the conductive regions 411-3 of the plug with the channel structure 417-3 aligns with respect to the top of the gate 419-3. This alignment of the interface 431-3 at the top of the gate 419-3 with respect to doping can have the cut between conductive regions ending vertically aligned with the top of the gate 419-3.

Figure 5:
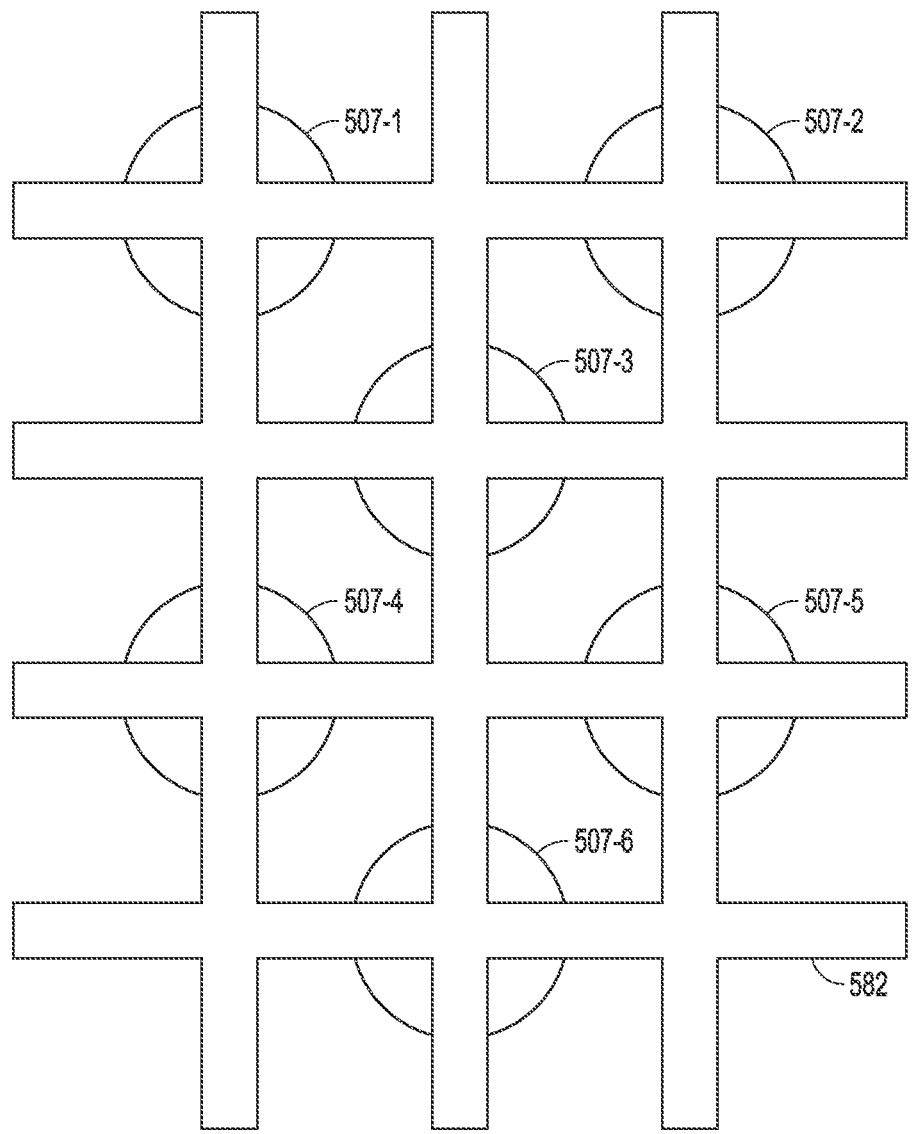
FIG. 5 illustrates an example of a mask with a pattern for processing dissected plugs for coupling data lines to channel structures in select transistors in pillars of a memory array, according to various embodiments.

FIG. 5 illustrates an example of a mask 582 with a pattern for processing dissected plugs for coupling data lines to channel structures in select gate transistors in pillars of a memory array. Pillars 507-0, 507-1, 507-2, 507-3, 507-4, 507-5, and 507-6 for strings of memory cells of a memory array can be formed vertically from source lines in the memory array. Memory cells and select gate devices can be formed in the pillars 507-0, 507-1, 507-2, 507-3, 507-4, 507-5, and 507-6. The select gate transistors can be formed with the same structure as the memory cells. After forming the pillars 507-0, 507-1, 507-2, 507-3, 507-4, 507-5, and 507-6 containing select gate transistors and memory cells, and before forming data lines coupled to these pillars, conductive material for plugs can be formed on the channel structures of the topmost select gate transistors.

The mask 582 having a specific pattern can be formed on the plugs. The mask 582 can be used to remove portions of the conductive material in the plugs, forming dissected plugs with conductive regions separated by the slots. The portions can be removed using an appropriate etching process. The slots can be filled with dielectric material contacting the channel structure providing a dissected channel structure. The resulting dissected plugs are plugs of conductive regions separated by regions of non-conductive material. The dissected plug can be implemented with the mask 582 as an additional mask to conventional forming of strings of memory cells coupled to data lines and source lines in a memory array of a memory device. The mask 582 results in four conductive regions and four non-conductive regions for each plug. Other masks or combinations of masks can be used to generate a dissected plug with a different number of conductive and non-conductive regions. Though six pillars are shown, substantially more pillars for strings of memory cells in a memory array of a memory device can be formed.

Figure 6:
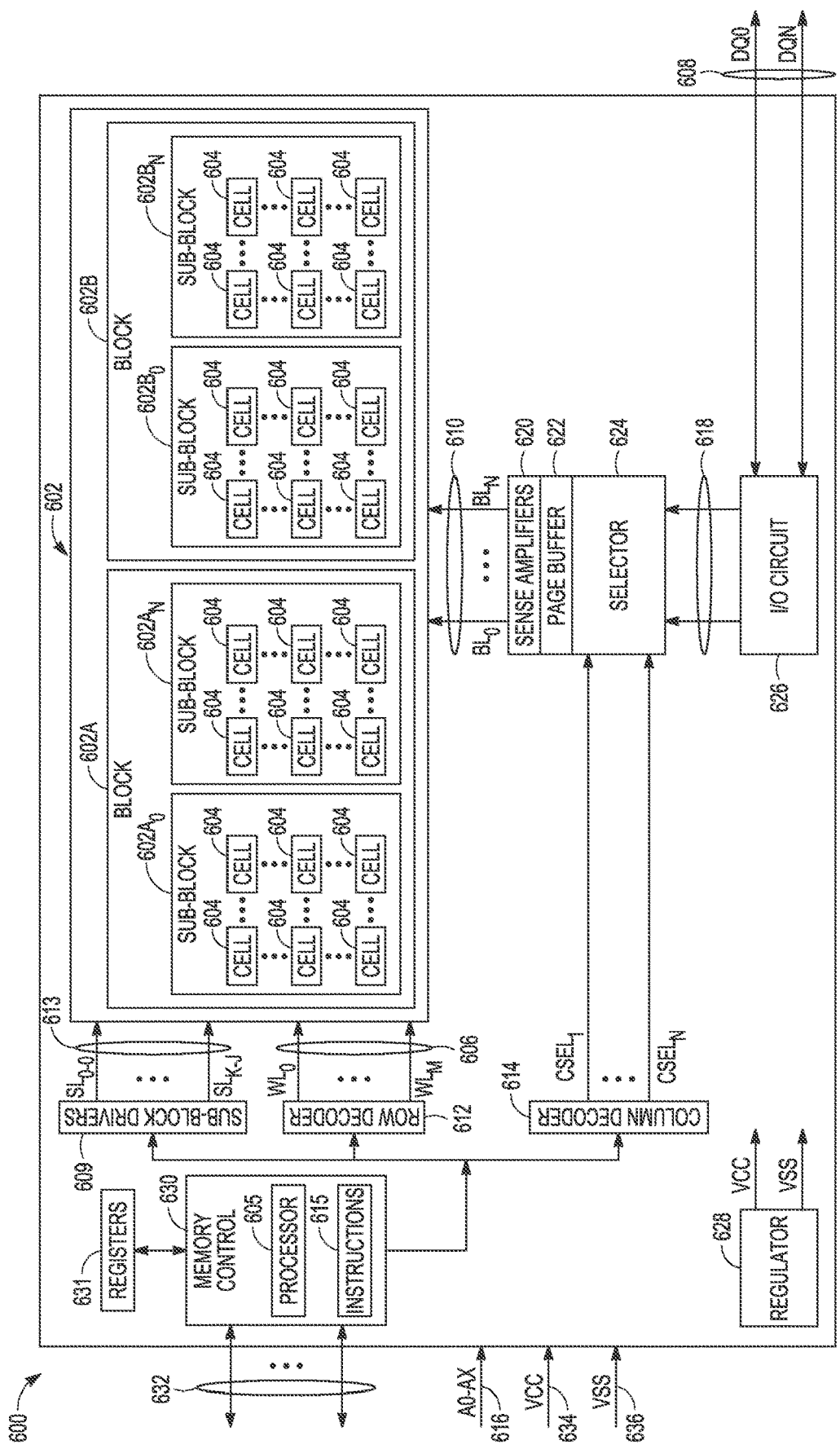
FIG. 6 illustrates a functional block diagram of an example memory device including a memory array having a plurality of memory cells, and one or more circuits or components to provide communication with, or perform one or more memory operations on, the memory array, according to various embodiments.

FIG. 6 illustrates a functional block diagram of an example memory device 600 including a memory array 602 having a plurality of memory cells 604, and one or more circuits or components to provide communication with, or perform one or more memory operations on, the memory array 602. The memory device 600 can be a memory die, for example, a NAND memory die. The memory array 602 can be implemented similar to the memory array 100 of FIG. 1. The memory device 600 can include a row decoder 612, a column decoder 614, sub-block drivers 609, sense amplifiers 620, a page buffer 622, a selector 624, an I/O circuit 626, and a memory controller 630. The memory controller 630 can include processing circuitry, including one or more processors 605, and can be configured to perform operations of the memory device 600 by executing instructions 615. For purposes of the present example, the instructions 615 may be performed by memory within or dedicated to memory controller 630. In other examples, at least some portion of the instructions executed by memory controller 630 may be stored in other memory structures and loaded, for example into local (memory controller) memory for execution by the memory controller 630. The operations can include an erase algorithm using a dissected plug as a contact to a select gate transistor between a data line and the select gate transistor for a string of memory cells as taught herein.

The memory cells 604 of the memory array 602 can be arranged in blocks, such as first and second blocks 602A, 602B. Each block can include sub-blocks. For example, the first block 602A can include first and second sub-blocks $602A_0$, $602A_N$, and the second block 602B can include first and second sub-blocks $602B_0$, $602B_N$. Each sub-block can include a number of physical pages, with each page including a number of memory cells 604. Although illustrated herein as having two blocks, with each block having two sub-blocks, and each sub-block having a number of memory cells 604, in other examples, the memory array 602 can include more or fewer blocks, sub-blocks, memory cells, etc. In other examples, the memory cells 604 can be arranged in a number of rows, columns, pages, sub-blocks, blocks, etc., and accessed using, for example, access lines 606, first data lines 610, or one or more select gates, source lines, etc.

The memory controller 630 can control memory operations of the memory device 600 according to one or more signals or instructions received on control lines 632, including, for example, one or more clock signals or control signals that indicate a desired operation (e.g., write, read, erase, etc.), or address signals (A0-AX) received on one or more address lines 616. One or more devices external to the memory device 600 can control the values of the control signals on the control lines 632 or the address signals on the address line 616. Examples of devices external to the memory device 600 can include, but are not limited to, a host, an external memory controller, a processor, or one or more circuits or components not illustrated in FIG. 6.

The memory device 600 can use access lines 606 and first data lines 610 to transfer data to (e.g., write or erase) or from (e.g., read) one or more of the memory cells 604. The row decoder 612 and the column decoder 614 can receive and decode the address signals (A0-AX) from the address line 616, can determine which of the memory cells 604 are to be accessed, and can provide signals to one or more of the access lines 606 (e.g., one or more of a plurality of access lines ($WL_0$-$WL_M$)) or the first data lines 610 (e.g., one or more of a plurality of data lines (BL0-BLN)), such as described above.

The memory device 600 can include sense circuitry, such as the sense amplifiers 620, configured to determine the values of data on (e.g., read), or to determine the values of data to be written to, the memory cells 604 using the first data lines 610. For example, in a selected string of memory cells 604, one or more of the sense amplifiers 620 can read a logic level in the selected memory cell 604 in response to a read current flowing in the memory array 602 through the selected string associated with the data lines 610.

One or more devices external to the memory device 600 can communicate with the memory device 600 using the I/O lines (DQ0-DQN) 608, address lines 616 (A0-AX), or control lines 632. The I/O circuit 626 can transfer values of data in or out of the memory device 600, such as in or out of the page buffer 622 or the memory array 602, using the I/O lines 608, according to, for example, the control lines 632 and address lines 616. The page buffer 622 can store data received from the one or more devices external to the memory device 600 before the data is programmed into relevant portions of the memory array 602, or can store data read from the memory array 602 before the data is transmitted to the one or more devices external to the memory device 600.

The column decoder 614 can receive and decode address signals (A0-AX) into one or more column select signals ($CSEL_1$-$CSEL_N$). The selector 624 (e.g., a select circuit) can receive the column select signals ($CSEL_1$-$CSEL_N$) and select data in the page buffer 622 representing values of data to be read from or to be programmed into memory cells 604. Selected data can be transferred between the page buffer 622 and the I/O circuit 626 using second data lines 618.

The memory controller 630 can receive positive and negative supply signals, such as a supply voltage (Vcc) 634 and a negative supply (Vss) 636 (e.g., a ground potential) with respect to Vcc, from an external source or supply (e.g., an internal or external battery, an AC-to-DC converter, etc.). In certain examples, the memory controller 630 can include a regulator 628 to internally provide positive or negative supply signals.

To program or write data to a memory cell, a VPGM (e.g., one or more programming pulses, etc.) can be applied to selected access lines (e.g., $WL_i$), and, thus, to a control gate of each memory cell coupled to the selected access lines. Programming pulses can begin, for example, at or near 15V, and, in certain examples, can increase in magnitude during each programming pulse application. While the program voltage is applied to the selected access lines, a potential, such as a ground potential (e.g., Vss), can be applied to the data lines and substrates (and thus the channel structures between the sources and drains) of the memory cells targeted for programming, resulting in a charge transfer (e.g., direct injection or Fowler-Nordheim (FN) tunneling, etc.) from the channel structures to the floating gates of the targeted memory cells.

In contrast, a Vpass can be applied to one or more access lines having memory cells that are not targeted for programming, or an inhibit voltage (e.g., Vcc) can be applied to data lines having memory cells that are not targeted for programming, for example, to inhibit charge from being transferred from the channel structures to the floating gates of such non-targeted memory cells. The pass voltage can be variable, depending, for example, on the proximity of the applied pass voltages to an access line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific access line, such as WL4, a pass voltage of 10V can be applied to one or more other access lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of access lines, etc., can be higher or lower, or more or less.

Between applications of one or more programming pulses (e.g., VPGM), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically VPGM) can be applied to the substrates (and thus the channel structures, between the sources and drains) of the memory cells targeted for erasure (e.g., using one or more data lines, select gates, etc.), while the access lines of the targeted memory cells are kept at a potential, such as a ground potential (e.g., Vss), resulting in a charge transfer (e.g., direct injection or FN tunneling, etc.) from the floating gates of the targeted memory cells to the channel structures.

When a host, which is a user device, sends an address to the memory device 600, it typically can have an identification of a block, a page, and a column. The identification of the block is used to select the block of interest in the operation. The identification of page is used to select the WL on which the page resides, and it also is used to select one particular sub-block as the WL is shared among the sub-blocks of the block. The sub-block on which the page resides is decoded and that sub-block is selected. The address provided by the user device is used to turn on and off the selector device and access memory cells. In typical operations, one sub-block only is selected such that SGDs of one sub-block are active.

Based on the address provided by the user device, the memory controller 630 can select any one sub-block or all sub-blocks. The memory controller 630 can generate the sub-block address to the sub-block drivers 609 and select any one sub-block or all sub-blocks. The memory controller 630 can send the WL information to the row decoder 612 and a column address to the column decoder 614.

The sub-block drivers 609 can include a number of independent drivers that generates signals to select lines 613 $SL_{0-0}$ ... $SL_{K-J}$. For an architecture in which each string includes a series of SGD0, SGD1 and SGD2 devices, each of the SGD0, SGD1 and SGD2 devices in each sub-block has its own driver such that they can be controlled individually, such that per each sub-block, there are three SGD drivers. For N sub-blocks having M SGDs, there are M*N individual drivers that can be addressed. For example, for four sub-blocks having three SGDs, the sub-block drivers 609 can have 12 drivers that can be addressed. There is full flexibility on either turning on one SGD (SGD0, SGD1, or SGD2) in one sub-block or all sub-blocks. Similarly, there is full flexibility to turn on all SGDs (SG0, SGD1, and SGD2) at the same time on one sub-block or all sub-blocks. Similarly, the sub-block drivers 609 can include R*N drivers for R SGS devices in the N sub-blocks. Multiple input signals can be assigned to each individual driver, depending on the different voltages designed for operation of the respective driver during erase operations, program operations, and read operations. From the sub-block drivers 609, appropriate operational signals can be sent to the memory array 602 via the select lines 613 ($SL_{(sub\text{-}block\ \#)\text{-}(SGD\ \#\ or\ SGS\ \#)}$) $SL_{0-0}$ ... $SL_{K-J}$.

In typical read and write operations, SGD0, SGD1, SGD2 devices in one sub-block can be driven together by one particular regulator, while the select gates in other sub-blocks are driven to another voltage such as ground (0V). This is a case of a vertical gang with one signal driving all select gates in a given sub-block. The instructions to finish erase verify operations can be provided by the instructions 615 in the memory controller 630 on the memory device 600.

Figure 7:
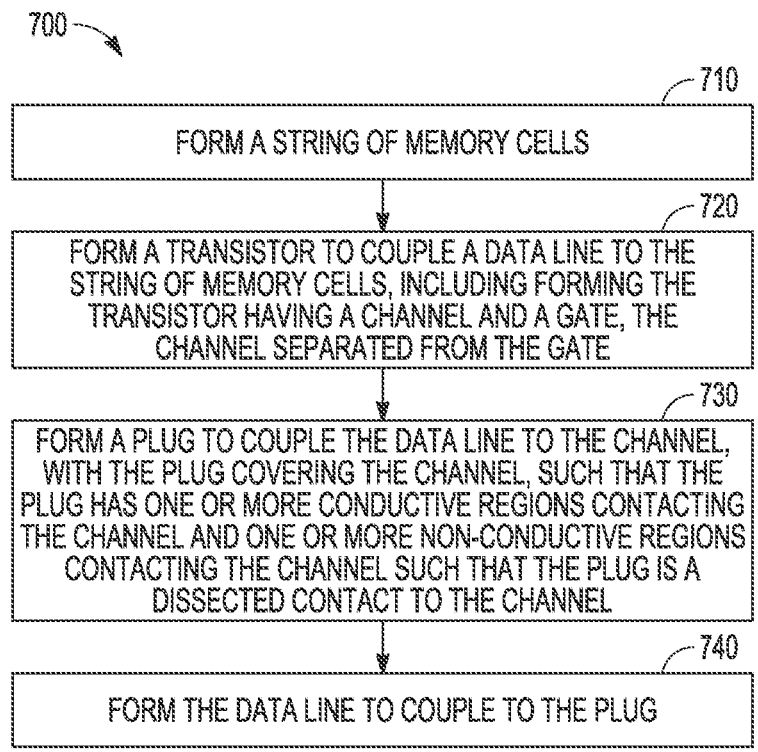
FIG. 7 is a flow diagram of features of an example method of forming a memory array of a memory device, according to various embodiments.

FIG. 7 is a flow diagram of features of an embodiment of an example method 700 of forming a memory array of a memory device. At 710, a string of memory cells is formed. At 720, a transistor is formed to couple a data line to the string of memory cells. The transistor is formed having a channel structure and a gate, where the channel structure is separated from the gate. At 730, a plug is formed to couple the data line to the channel structure, with the plug covering the channel structure. The plug has one or more conductive regions contacting the channel structure and one or more non-conductive regions contacting the channel structure such that the plug is a dissected contact to the channel structure. For those regions of the channel structure not covered by the plug, these regions can be covered by dielectric material vertically adjacent and contacting the plug. Forming the one or more conductive regions can include forming four or more conductive regions. At 740, the data line is formed to couple to the plug.

Variations of the method 700 or methods similar to the method 700 can include a number of different embodiments that may be combined depending on the application of such methods and/or the architecture of memory devices in which such methods are implemented. Such methods can include selecting a first dopant for the one or more conductive regions and a second dopant for the channel structure with respect to a junction between the one or more conductive regions and the channel structure such that the first dopant and the second dopant have characteristics to enhance band-to-band band tunneling characteristics in operation of the transistor in addition to the dissected contact provided by the plug. Variations can include forming the channel structure surrounding a core of dielectric material and forming the one or more non-conductive regions composed of the dielectric material.

Variations of the method 700 or methods similar to the method 700 can include forming the one or more conductive regions of the plug having a first dopant and forming the channel structure having a second dopant such that the one or more conductive regions are heavily doped relative to doping of the channel structure. Forming the one or more conductive regions can include forming the one or more conductive regions having an end of the first dopant aligning with a top level of the gate or above the top level of the gate. Forming the one or more conductive regions can include forming the one or more conductive regions with slots between the one or more conductive regions such that an end of a slot aligns with a top level of the gate or above the top level of the gate.

Figure 8:
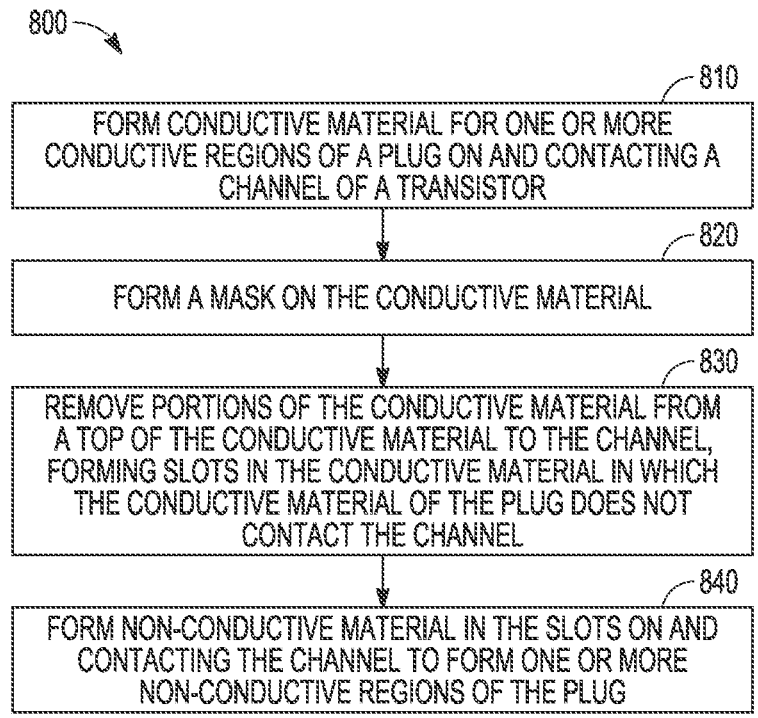
FIG. 8 is a flow diagram of features of an example method of forming a plug to couple a data line to a channel structure, providing a dissected contact to the channel structure, according to various embodiments.

FIG. 8 is a flow diagram of features of an embodiment of an example method 800 of forming a plug to couple a data line to a channel structure of a transistor, providing a dissected contact to the channel structure. The method 800 can be used in the method 700 or methods similar to the method 700. At 810, conductive material is formed, for one or more conductive regions of the plug, on and contacting the channel structure of the transistor. At 820, a mask is formed on the conductive material. At 830, portions of the conductive material from a top of the conductive material to the channel structure are removed. The removal can be performed using an appropriate etch process. Removing portions of the conductive memory is used in forming slots in the conductive material in which the conductive material of the plug does not contact the channel structure. At 840, non-conductive material is formed in the slots on and contacting the channel structure to form one or more non-conductive regions of the plug. Forming the non-conductive material on and contacting the channel structure forms the plug as a dissected contact to the channel structure.

In various embodiments, a memory device comprises a string of memory cells, a data line, a transistor to couple the data line to the string of memory cells. The transistor has a channel structure and a gate, where the channel structure is separated from the gate. The memory device includes a plug to couple the data line to the channel structure of the transistor. The plug can cover the channel structure, with the plug having one or more conductive regions contacting the channel structure and one or more non-conductive regions contacting the channel structure such that the plug is a dissected contact between the data line and the channel structure. The one or more conductive regions of the plug can be heavily doped relative to doping of the channel structure.

Variations of such a memory device or similar memory devices can include a number of different embodiments that may be combined depending on the application of such memory devices and/or the architecture in which such memory devices are implemented. Such memory devices can include an end of a heavily doped conductive region of the one or more conductive regions aligning with a top level of the gate. In another embodiment, an end of a heavily doped conductive region of the one or more conductive regions is above a top level of the gate. Alternatively, an end of a heavily doped conductive region of the one or more conductive regions is below a top level of the gate. Variations can include an end of one or more non-conductive regions of the plug aligning with a top of the gate. Variations can include the one or more conductive regions having four or more conductive regions.

Material of the channel structure of the transistor coupled to the string can extend to and through the memory cells of the string as channel structures of the memory cells with the channel structures of the transistor and the memory cells structured as cylindrical-like regions in a pillar above a substrate. The channel structure can surround a core of dielectric material, where the one or more non-conductive regions of the plug include the dielectric material.

In various embodiments, a memory system comprises multiple memory devices. One or more of the memory devices can include data lines and a memory array having strings of memory cells with each string formed in a pillar and coupled to a transistor formed in the pillar. The transistor is arranged to couple the string to a data line of the data lines, where the transistor has a channel structure and a gate, with the channel structure separated from the gate. The transistor can be structured with the channel structure contacting a plug to couple to the data line, with the plug covering the channel structure. The plug can have one or more conductive regions contacting the channel structure and one or more non-conductive regions contacting the channel structure such that the plug is a dissected contact between the data line and the channel structure. For those regions of the channel structure not covered by the plug, these regions can be covered by dielectric material vertically adjacent and contacting the plug. One or more of the memory devices includes a memory controller including processing circuitry including one or more processors. The memory controller can be configured to perform operations comprising performing an erase operation to a selected string of the memory array by applying an erase voltage to the gate of the transistor coupling the selected string to the data line associated with the selected string. The erase operation can be applied to multiple strings of the memory array.

Variations of such a memory system or similar memory systems can include a number of different embodiments that may be combined depending on the application of such memory systems and/or the architecture in which such memory systems are implemented. Such memory systems can include the one or more conductive regions of the plug being heavily doped relative to doping of the channel structure. Variations can include an end of a heavily doped conductive region of the one or more conductive regions aligning with a top level of the gate. In another embodiment, an end of a heavily doped conductive region of the one or more conductive regions is above a top level of the gate. Variations can include an end of one or more non-conductive regions of the plug aligning with a top of the gate. Variations can include the one or more conductive regions being four in number. More or less than four conductive regions can be used.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., Internet-of-Things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, an SSD, an MMC, or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

Figure 9:
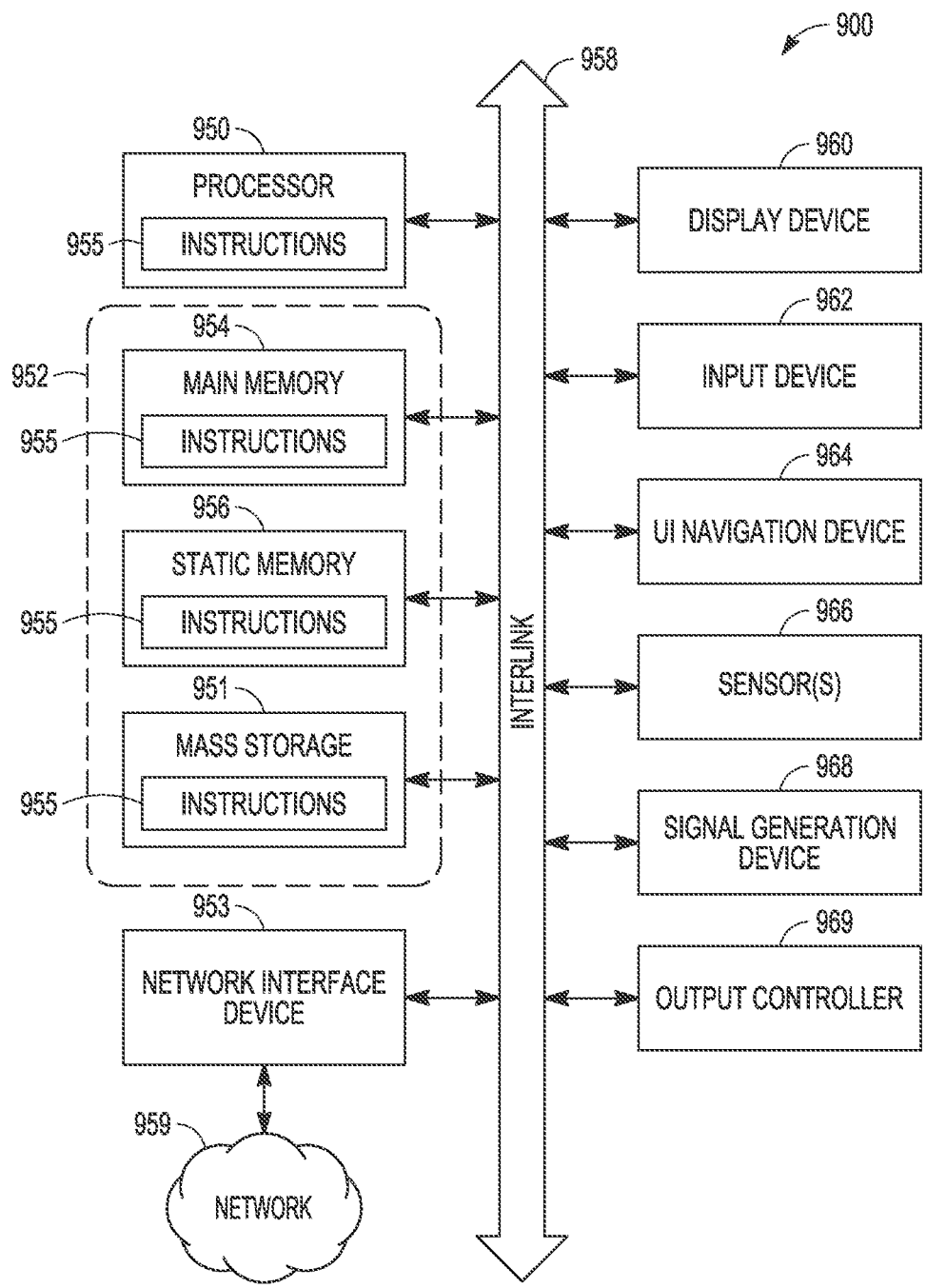
FIG. 9 is a block diagram of an example machine having one or more memory devices structured to enhance band-to-band tunneling in select gate transistors coupling data lines to strings of memory cells in a memory array of the one or more memory devices during erase operations, according to various embodiments.

FIG. 9 is a block diagram of an example machine having one or more memory devices structured to enhance band-to-band tunneling in select gate transistors coupling data lines to strings of memory cells in a memory array of the one or more memory devices during erase operations. The machine 900, having one or more such memory devices, may operate as a standalone machine or may be connected, for example networked, to other machines.

In a networked deployment, the machine 900 may operate in the capacity of a server machine, a client machine, or both in server-client network environments. In an example, the machine 900 may act as a peer machine in peer-to-peer (P2P) (or other distributed) network environment. The machine 900 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations. The example machine 900 can be arranged to operate with one or more memory devices having dissected channel structures of topmost select gate transistors coupling strings of memory cells to associated data lines in the one or more memory devices, as taught herein. The example machine 900 can include one or more memory devices having structures as discussed with respect to the memory array 100 of FIG. 1 and the dissected plug 211 structure associated with FIGS. 2 and 3, and the memory device 600 of FIG. 6.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent can be changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 900 may include a hardware processor 950 (e.g., a CPU, a GPU, a hardware processor core, or any combination thereof), a main memory 954, and a static memory 956, some or all of which may communicate with each other via an interlink (e.g., bus) 958. The machine 900 may further include a display device 960, an alphanumeric input device 962 (e.g., a keyboard), and a user interface (UI) navigation device 964 (e.g., a mouse). In an example, the display device 960, input device 962, and UI navigation device 964 may be a touch screen display. The machine 900 may additionally include a mass storage device (e.g., drive unit) 951, a signal generation device 968 (e.g., a speaker), a network interface device 953, and one or more sensors 966, such as a global positioning system (GPS) sensor, compass, accelerometer, or other sensor. The machine 900 may include an output controller 969, such as a serial (e.g., USB, parallel, or other wired or wireless (e.g., infrared (IR), near field communication (NFC), etc.) connection to communicate or control one or more peripheral devices (e.g., a printer, card reader, etc.).

The machine 900 may include a machine-readable medium 952 on which is stored one or more sets of data structures or instructions 955 (e.g., software) embodying or utilized by the machine 900 to perform any one or more of the techniques or functions for which the machine 900 is designed. The instructions 955 may also reside, completely or at least partially, within the main memory 954, within static memory 956, within the mass storage device 951, or within the hardware processor 950 during execution thereof by the machine 900. In an example, one or any combination of the hardware processor 950, the main memory 954, the static memory 956, or the mass storage device 951 may constitute the machine-readable medium 952.

While the machine-readable medium 952 is illustrated as a single medium, the term "machine-readable medium" may include a single medium or multiple media (e.g., a centralized or distributed database, or associated caches and servers) configured to store the one or more instructions 955. The term "machine-readable medium" may include any medium that is capable of storing or encoding instructions for execution by the machine 900 and that cause the machine 900 to perform any one or more of the techniques to which the machine 900 is designed, or that is capable of storing or encoding data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

The instructions 955 (e.g., software, programs, an operating system (OS), etc.) or other data, stored on the mass storage device 951, can be accessed by the main memory 954 for use by the processor 950. The main memory 954 (e.g., DRAM) is typically fast, but volatile, and thus a different type of storage than the mass storage device 951 (e.g., an SSD), which is suitable for long-term storage, including while in an "off" condition. The instructions 955 or data in use by a user or the machine 900 are typically loaded in the main memory 954 for use by the processor 950. When the main memory 954 is full, virtual space from the mass storage device 951 can be allocated to supplement the main memory 954; however, because the mass storage device 951 is typically slower than the main memory 954, and write speeds are typically at least twice as slow as read speeds, use of virtual memory can greatly reduce user experience due to storage device latency (in contrast to the main memory 954, e.g., DRAM). Further, use of the mass storage device 951 for virtual memory can greatly reduce the usable lifespan of the mass storage device 951.

In contrast to virtual memory, virtual memory compression (e.g., the Linux® kernel feature "ZRAM") uses part of the memory as compressed block storage to avoid paging to the mass storage device 951. Paging takes place in the compressed block until it is necessary to write such data to the mass storage device 951. Virtual memory compression increases the usable size of main memory 954, while reducing wear on the mass storage device 951.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival SATA-based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

The instructions 955 may further be transmitted or received over a communications network 959 using a transmission medium via the network interface device 953 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 953 may include one or more physical jacks (e.g., Ethernet, coaxial, or phone jacks) or one or more antennas to connect to the communications network 959. In an example, the network interface device 953 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by the machine 900, and includes instrumentalities to propagate digital or analog communications signals to facilitate communication of such instructions, which instructions may be implemented by software.

The following are example embodiments of devices and methods, in accordance with the teachings herein.

An example memory device 1 can comprise: a string of memory cells; a data line; a transistor to couple the data line to the string of memory cells, the transistor having a channel structure and a gate, the channel structure separated from the gate; and a plug to couple the data line to the channel structure, with the plug covering the channel structure, the plug having one or more conductive regions contacting the channel structure and one or more non-conductive regions contacting the channel structure such that the plug is a dissected contact between the data line and the channel structure.

An example memory device 2 can include features of example memory device 1 and can include the one or more conductive regions of the plug being heavily doped relative to doping of the channel structure.

An example memory device 3 can include features of example memory device 2 and example memory device 1 and can include an end of a heavily doped conductive region of the one or more conductive regions that aligns with a top level of the gate.

An example memory device 4 can include features of example memory device 2 and features of any of memory devices 1 and 3 and can include an end of a heavily doped conductive region of the one or more conductive regions being above a top level of the gate.

An example memory device 5 can include features of example memory device 2 and features of any of memory devices 1, 3, and 4 and can include an end of a heavily doped conductive region of the one or more conductive regions being below a top level of the gate.

An example memory device 6 can include features of any of the preceding example memory devices and can include the one or more conductive regions to include four or more conductive regions.

An example memory device 7 can include features of any of the preceding example memory devices and can include material of the channel structure of the transistor extending to and through the memory cells as channel structures of the memory cells with the channel structures of the transistor and the memory cells structured as cylindrical-like regions in a pillar above a substrate.

An example memory device 8 can include features of any of the preceding example memory devices and can include the channel structure surrounding a core of dielectric material and the one or more non-conductive regions including the dielectric material.

In an example memory device 9, any of the memory devices of example memory devices 1 to 8 may include memory devices incorporated into an electronic memory apparatus further comprising a host processor and a communication bus extending between the host processor and the memory device.

In an example memory device 10, any of the memory devices of example memory devices 1 to 9 may be modified to include any structure presented in another of example memory device 1 to 9.

In an example memory device 11, any of the memory devices of example memory devices 1 to 10 may be modified to include any structure presented in another of example memory device 1 to 10.

In an example memory device 12, any apparatus associated with the memory devices of example memory devices 1 to 11 may further include a machine-readable storage device configured to store instructions as a physical state, wherein the instructions may be used to perform one or more operations of the apparatus.

In an example memory device 13, any of the memory devices of example memory devices 1 to 12 may be operated in accordance with any of the methods of the below example methods 1 to 11.

An example memory device 14 can comprise: A memory system comprising: multiple memory devices, with one or more of the memory devices including: data lines; a memory array having strings of memory cells with each string formed in a pillar and coupled to a transistor formed in the pillar, the transistor to couple the string to a data line of the data lines, the transistor having a channel structure and a gate, the channel structure separated from the gate, the transistor structured with the channel structure contacting a plug to couple to the data line, with the plug covering the channel structure, the plug having one or more conductive regions contacting the channel structure and one or more non-conductive regions contacting the channel structure such that the plug is a dissected contact between the data line and the channel structure; and a memory controller including processing circuitry including one or more processors, the memory controller configured to perform operations comprising performing an erase operation to a selected string of the memory array by applying an erase voltage to the gate of the transistor coupling the selected string to the data line associated with the selected string.

An example memory device 15 can include features of example memory device 14 and can include the one or more conductive regions of the plug being heavily doped relative to doping of the channel structure.

An example memory device 16 can include features of memory device 15 and features of example memory device 14 and can include an end of a heavily doped conductive region of the one or more conductive regions aligning with a top level of the gate.

An example memory device 17 can include features of memory device 15 and features of example memory devices 14 and 16 and can include an end of a heavily doped conductive region of the one or more conductive regions being above a top level of the gate.

An example memory device 18 can include features of any of the preceding example memory devices 14 to 17 and can include the one or more conductive regions being four in number.

In an example memory device 19, any of the memory devices of example memory devices 14 to 18 may include memory devices incorporated into an electronic memory apparatus further comprising a host processor and a communication bus extending between the host processor and the memory device.

In an example memory device 20, any of the memory devices of example memory devices 14 to 19 may be modified to include any structure presented in another of example memory device 14 to 19.

In an example memory device 21, any of apparatus associated with the memory devices of example memory devices 14 to 20 may further include a machine-readable storage device configured to store instructions as a physical state, wherein the instructions may be used to perform one or more operations of the apparatus.

In an example memory device 22, any of the memory devices of example memory devices 14 to 21 may be operated in accordance with any of the methods of the following example methods 1 to 11.

An example method 1 of forming a memory array of a memory device can comprise: forming a string of memory cells; forming a transistor to couple a data line to the string of memory cells, including forming the transistor having a channel structure and a gate, the channel structure separated from the gate; forming a plug to couple the data line to the channel structure, with the plug covering the channel structure, such that the plug has one or more conductive regions contacting the channel structure and one or more non-conductive regions contacting the channel structure such that the plug is a dissected contact to the channel structure; and forming the data line to couple to the plug.

An example method 2 of forming a memory array of a memory device can include features of example method 1 of forming a memory array of a memory device and can include forming the plug to include: forming conductive material of the one or more conductive regions on and contacting the channel structure; forming a mask on the conductive material; removing portions of the conductive material from a top of the plug to the channel structure, forming slots in the plug in which the conductive material of the plug does not contact the channel structure; and forming non-conductive material in the slots on and contacting the channel structure to form the one or more non-conductive regions of the plug.

An example method 3 of forming a memory array of a memory device can include features of any of the preceding example methods of forming a memory array of a memory device and can include selecting a first dopant for the one or more conductive regions and a second dopant for the channel structure with respect to a junction between the one or more conductive regions and the channel structure such that the first dopant and the second dopant have characteristics to enhance band-to-band band tunneling characteristics in operation of the transistor in addition to the dissected contact provided by the plug.

An example method 4 of forming a memory array of a memory device can include features of any of the preceding example methods of forming a memory array of a memory device and can include forming the one or more conductive regions to include forming four or more conductive regions.

An example method 5 of forming a memory array of a memory device can include features of any of the preceding example methods of forming a memory array of a memory device and can include forming the channel structure surrounding a core of dielectric material and forming the one or more non-conductive regions composed of the dielectric material.

An example method 6 of forming a memory array of a memory device can include features of any of the preceding example methods of forming a memory array of a memory device and can include forming the one or more conductive regions of the plug having a first dopant and forming the channel structure having a second dopant such that the one or more conductive regions are heavily doped relative to doping of the channel structure.

An example method 7 of forming a memory array of a memory device can include features of example method 6 of forming a memory array of a memory device and any of the preceding example methods of forming a memory array of a memory device and can include forming the one or more conductive regions to include forming the one or more conductive regions having an end of the first dopant aligning with a top level of the gate or above the top level of the gate.

In an example method 8 of forming a memory array of a memory device, any of the example methods 1 to 7 of forming a memory array of a memory device may be performed in an electronic memory apparatus further comprising a host processor and a communication bus extending between the host processor and the memory device.

In an example method 9 of forming a memory array of a memory device, any of the example methods 1 to 8 of forming a memory array of a memory device may be modified to include operations set forth in any other of method examples 1 to 6 of forming a memory array of a memory device.

In an example method 10 of forming a memory array of a memory device, any of the example methods 1 to 9 of forming a memory array of a memory device may be implemented at least in part through use of instructions stored as a physical state in one or more machine-readable storage devices.

An example method 11 of forming a memory array of a memory device can include features of any of the preceding example methods 1 to 10 of forming a memory array of a memory device and can include performing functions associated with any features of example memory devices 1 to 22.

An example machine-readable storage device 1 storing instructions, that when executed by one or more processors, cause a machine to perform operations, can comprise instructions to perform functions associated with any features of example memory devices 1 to 13 and memory devices 14 to 22 or perform methods associated with any features of example methods 1 to 11.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. The above description is intended to be illustrative, and not restrictive, and the phraseology or terminology employed herein is for the purpose of description. In addition, in the foregoing Detailed Description, it can be seen that various features are grouped together in a single embodiment for the purpose of streamlining the disclosure. Combinations of the above embodiments and other embodiments will be apparent to those of skill in the art upon studying the above description.

What is claimed is:

1. A memory device comprising:
a pillar disposed vertically as part of a memory array;
multiple transistors arranged along the pillar, with the pillar including a channel structure for each transistor of the multiple transistors;
a data line; and
a dissected contact between the data line and the channel structure, the dissected contact having one or more conductive regions contacting the channel structure and one or more non-conductive regions contacting the channel structure.

2. The memory device of claim 1, wherein the one or more conductive regions of the dissected contact are heavily doped relative to doping of the channel structure.

3. The memory device of claim 2, wherein the doping in the one or more conductive regions and the channel structure is n-type doping.

4. The memory device of claim 1, wherein the multiple transistors include a select gate transistor arranged as a topmost transistor of the multiple transistors, the select gate transistor coupled to the data line by the dissected contact.

5. The memory device of claim 4, wherein a doping interface of the dissected contact with the channel structure of the select gate transistor is located above a top of a gate of the select gate transistor with cuts between the one or more conductive regions extending vertically below the interface.

6. The memory device of claim 4, wherein a doping interface of the dissected contact with the channel structure of the select gate transistor is located below a top of a gate of the select gate transistor with cuts between the one or more conductive regions ending above the interface.

7. The memory device of claim 4, wherein a doping interface of the dissected contact with the channel structure of the select gate transistor aligns with a top of a gate of the select gate transistor with cuts between the one or more conductive regions ending vertically aligned with the top of the gate.

8. The memory device of claim 1, wherein the one or more conductive regions include four or more conductive regions.

9. The memory device of claim 1, wherein the channel structure is arranged as a cylindrical channel structure in the pillar above a source line.

10. The memory device of claim 1, wherein material of the pillar includes polysilicon.

11. The memory device of claim 1, wherein the channel structure surrounds a core of dielectric material and the one or more non-conductive regions include the dielectric material.

12. The memory device of claim 11, wherein the dielectric material includes an insulating oxide.

13. The memory device of claim 1, wherein doping of a junction between the dissected contact and the channel structure is optimized with respect to band-to-band charge generation for drain side current Gate-Induced-Drain-Leakage of a topmost transistor of the multiple transistors in an erase operation.

14. A memory device comprising:
 a pillar disposed vertically above a source line as part of a memory array;
 multiple transistors arranged along the pillar, with the pillar including a channel structure for each transistor of the multiple transistors;
 a data line; and
 a dissected contact between the data line and the channel structure, the dissected contact having one or more conductive regions contacting the channel structure and one or more non-conductive regions contacting the channel structure, the one or more conductive regions of the dissected contact being heavily doped relative to doping of the channel structure, with doping of a junction between the dissected contact and the channel structure being optimized with respect to band-to-band charge generation for drain side current Gate-Induced-Drain-Leakage of a topmost transistor of the multiple transistors in an erase operation.

15. The memory device of claim 14, wherein the multiple transistors include a portion of the multiple transistors being memory cells arranged between the topmost transistor of the multiple transistors and the source line, with the memory cells and the topmost transistor having a common structural design.

16. The memory device of claim 15, wherein each transistor of the portion of the multiple transistors and the topmost transistor includes a charge trap region separated from the channel structure by a tunnel region and separated from a gate of the transistor by a blocking dielectric adjacent the charge trap region with a dielectric barrier between and contacting the blocking dielectric and the gate.

17. The memory device of claim 16, wherein the dielectric barrier includes a high-k dielectric.

18. A method of forming a memory device, the method comprising:
 forming a pillar disposed vertically as part of a memory array;
 forming multiple transistors arranged along the pillar, with the pillar including a channel structure for each transistor of the multiple transistors;
 forming a dissected contact on the channel structure, the dissected contact having one or more conductive regions contacting the channel structure and one or more non-conductive regions contacting the channel structure; and
 forming a data line to couple to the dissected contact.

19. The method of claim 18, wherein the method includes selecting a first dopant for the one or more conductive regions and a second dopant for the channel structure with respect to a junction between the one or more conductive regions and the channel structure such that the first dopant and the second dopant enhance band-to-band band tunneling characteristics for drain side current Gate-Induced-Drain-Leakage of a topmost transistor of the multiple transistors in an erase operation.

20. The method of claim 18, wherein the method includes forming a doping interface of the dissected contact with the channel structure of a topmost transistor of the multiple transistors to align with a top of a gate of the topmost transistor.

* * * * *